United States Patent [19]
Oda et al.

[11] Patent Number: 5,254,319
[45] Date of Patent: Oct. 19, 1993

[54] SINGLE CRYSTAL PULLING APPARATUS

[75] Inventors: Michiaki Oda; Koji Mizuishi, both of Annaka, Japan

[73] Assignee: Shin-Etsu Handotai Co., Ltd., Japan

[21] Appl. No.: 829,900

[22] Filed: Feb. 3, 1992

[30] Foreign Application Priority Data

Feb. 8, 1991 [JP] Japan .................. 3-37895

[51] Int. Cl.$^5$ .......................................... C30B 15/10
[52] U.S. Cl. ........................... 422/249; 156/617.1; 156/618.1; 156/DIG. 93
[58] Field of Search ......... 156/617.1, 618.1, DIG. 93; 422/249

[56] References Cited

U.S. PATENT DOCUMENTS

| | | | |
|---|---|---|---|
| 2,893,847 | 7/1959 | Schweickert et al. | 422/249 |
| 2,975,036 | 3/1961 | Taylor et al. | 422/249 |
| 3,144,308 | 8/1964 | Tarter | 422/249 |
| 3,173,765 | 3/1965 | Gobat et al. | 156/DIG. 93 |
| 3,194,637 | 7/1965 | Longini et al. | 422/249 |
| 3,650,701 | 3/1972 | Forrat | 156/DIG. 93 |
| 3,953,281 | 4/1976 | Pantusco et al. | 156/DIG. 93 |
| 4,301,120 | 11/1981 | Sibley | 422/249 |
| 5,096,677 | 3/1992 | Katsuoka et al. | 422/249 |

Primary Examiner—Robert Kunemund
Attorney, Agent, or Firm—Whitham & Marhoefer

[57] ABSTRACT

Aa single crystal pulling apparatus installed on a frame body further includes a second frame body which is founded independently from the main chamber to rigidly support the winder assembly, and a hermetical and flexible tube which is provided between the winder assembly and the pull chamber to prevent any stress and vibration from travelling from the winder assembly to the pull chamber and vice versa, while providing a communication passage between the winder assembly and the pull chamber.

6 Claims, 3 Drawing Sheets

007
SINGLE CRYSTAL PULLING APPARATUS

BACKGROUND OF THE INVENTION

The present invention relates to a single crystal pulling apparatus for growing and pulling up a single crystal ingot from a molten polycrystal substance in accordance with the Czochralski (CZ) method.

The single crystal pulling apparatus of this kind comprises a main chamber wherein the single crystal is grown, and in this main chamber are housed a crucible for containing the polycrystal substance such as silicon and a heater arranged to surround the crucible. The heater is for heating and melting down the polycrystal substance in the crucible. Beneath the main chamber are provided mechanisms for rotating the crucible about the center line thereof to control the uniformity of the heat flux in the molten polycrystal substance during the crystal growing operation. Rising above the main chamber is a towering structure of a crystal pull chamber which is an upright, substantially cylindrical enclosure terminating in an upper structure of a crystal pulling mechanism containing a winder assembly. An isolation valve is provided between the main chamber and the pull chamber.

In such single crystal pulling apparatus, the single crystal is caused to grow from the lower tip of a seed crystal which is attached to the lower end of a pull device such as a wire suspended from the winder assembly and which is dipped in a polycrystal substance that is melted down in the crucible. As the pull wire together with the seed crystal is rotated and drawn up higher at a predetermined velocity, the desired single crystal is grown longer from the tip of the seed crystal. At the beginning of the single crystal pulling operation, the isolation valve is opened to thereby render the main chamber and the pull chamber into communication. Then, the air is drawn out of these chambers by means of a vacuum pump, and an inert gas such as argon is supplied to the chambers. Thus, the single crystal pulling operation is carried out in this inert gas atmosphere. When the single crystal pulling operation is completed, the single crystal ingot is brought up into the pull chamber, and after the isolation valve is closed to thereby interrupt the communication between the two chambers, the single crystal ingot is removed from the pull chamber.

In order to maintain the stability of the operation, as well as to obtain defectless single crystal, the wire and the crucible shaft (or more particularly the center line of the crucible) are aligned to be collinear with each other. It must be carefully observed that the wire does not depart substantially from the center line of the crucible.

(Problems the Invention seeks to solve)

However, in the conventional single crystal pulling apparatus, the crystal pulling mechanism containing the winder assembly is attached integrally and rigidly to the top portion of the pull chamber so that when the air in the main chamber is drawn by the vacuum pump and the main chamber is heated, the main chamber is deformed, and this causes the pull chamber to ascend, descend and/or tilt more or less whereby the winder assembly is displaced from its original proper position and the wire is shifted away from the center line of the crucible. When this occurs, the wire swirls, the seed crystal fails to stand vertically, and the crystal grows cranked and many other defects occur in the growing crystal.

Also, when the crystal pulling mechanism containing the winder assembly is attached integrally and rigidly to the pull chamber, the vibration created by the drive system of the winder assembly is propagated unmitigatedly to the pull chamber and the main chamber whereby the molten crystal in the crucible is rippled and the normal growth of the single crystal is affected.

The present invention was contrived in view of the above problems and it is, therefore, an object of the invention to provide a single crystal pulling apparatus which is designed such that the wire to draw up the single crystal is always kept aligned collinearly with the center axis (that is, the axis of rotation) of the crucible even when the main chamber is deformed by heat or otherwise, and also such that the vibration of the winder assembly is not propagated to the pull chamber, let alone the main chamber, so that the single crystal grown in it will have scarce defect and the single crystal pulling operation proceeds stably and dependably.

SUMMARY OF THE INVENTION

Means to solve the Problems)

In order to attain the above objects and others, the present inventors propose a single crystal pulling apparatus which has a main chamber steadied on a frame body founded on the floor, a pull chamber provided above the main chamber with an isolation valve provided between the two chambers, and a winder assembly provided above the pull chamber, wherein another frame body is founded independently from the main chamber and the pull chamber to rigidly support the winder assembly, and a hermetical and flexible tube is provided between the winder assembly and the pull chamber to communicate the winder assembly with the pull chamber.

In an embodiment of the invention, the second frame body is founded on the floor; and in another embodiment the second frame body is founded on the first frame body.

It is preferred that the flexible tube provided between the winder assembly and the pull chamber is bellows.

(Result of the Invention;

According to the invention, since the winder assembly is rigidly supported by the frame body which is founded independently from the main chamber and the pull chamber, the deformation of the main chamber caused by its evacuation and/or heating which causes the pull chamber to be displaced does not affect the position of the winder assembly by virtue of the first frame body as well as the second frame body. Hence, the winder assembly is stationary and the pull wire remains collinear with the center line of the crucible; as the result, the grown crystal does not get cranked, the wire does not swirl, and the seed crystal stays vertical and the crystal will grow defectless.

Furthermore, since the winder assembly is connected to the pull chamber via a flexible, contractible, expansible tube such as bellows, the vibration created by the drive system of the winder assembly is absorbed by the flexible tube and thereby prevented from reaching the pull chamber.

BRIEF DESCRIPTION OF THE DRAWINGS

These and other effects of the invention will be realized by reference to the description, taken in connection with the accompanying drawings, in which.

(Embodiments)

Next, a first embodiment of the invention will be described with reference to the attached drawings.

Figure 1:
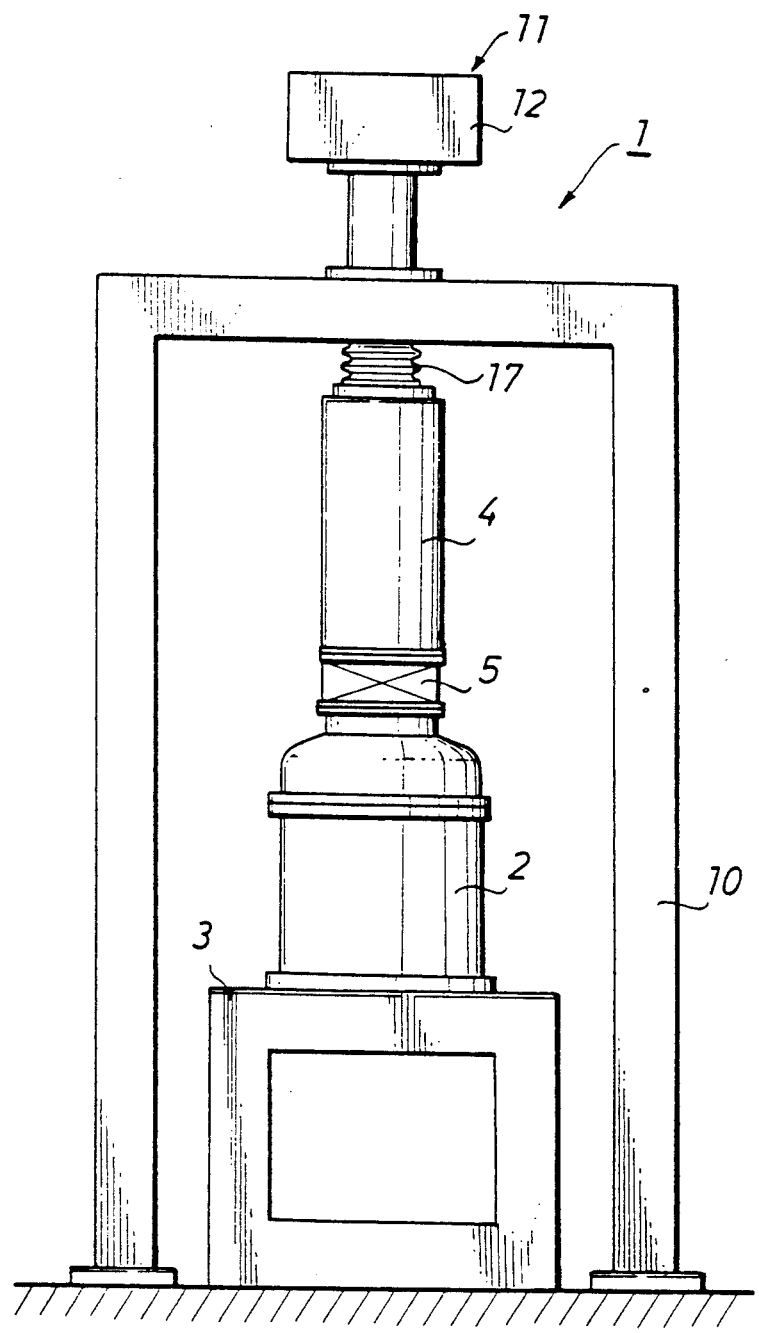
FIG. 1 is a front view of a single crystal pulling apparatus according to a first embodiment of the invention.
Figure 2:
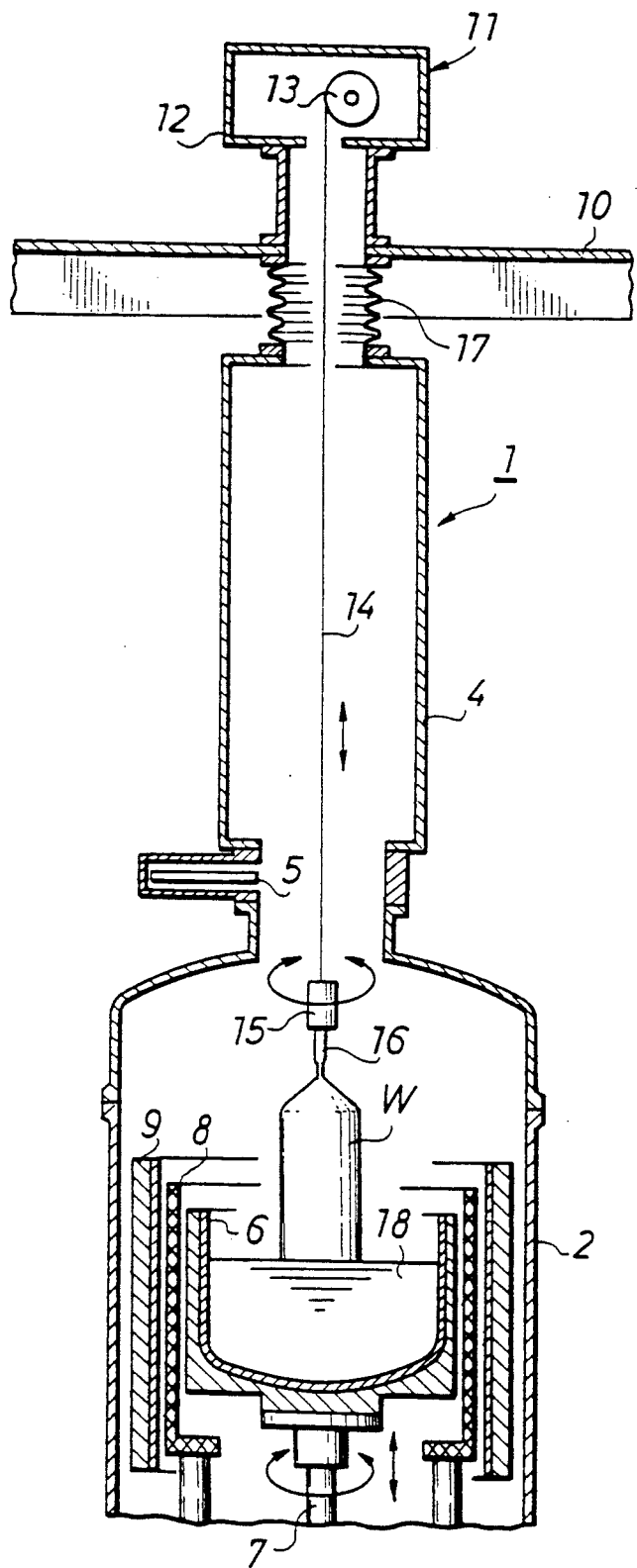
FIG. 2 is a longitudinal sectional view of the single crystal pulling apparatus of the first embodiment of the invention.

FIG. 1 shows the front view of the single crystal pulling apparatus 1 of the invention, and FIG. 2 shows the longitudinal section of the same apparatus 1. In FIG. 1 the reference numeral 2 designates a main chamber (a heating chamber with a water-cooled wall) comprising mainly of a stainless steel cylinder. The main chamber 2 is mounted on a frame 3 which is installed on the floor. A pull chamber 4 comprising mainly of a stainless steel cylinder is provided on top of the main chamber 2 in a coaxial alignment therewith for receiving in it the pulled-up grown single crystal ingot, and for providing a lateral exit for the ingot. An isolation valve 5 is provided between the two chambers 2, 4 for opening and closing the communication passage between the two chambers 2, 4.

As shown in FIG. 2, inside the main chamber 2 is a quartz crucible 6 which is fixed on top of a vertical crucible shaft 7, which 7 is adapted to turn about its axis and shifts vertically. Surrounding this crucible 6 is a cylindrical heater 8 made of carbon, and a cylindrical thermal insulator 9 also made of carbon is arranged to surround the heater 8. These elements 6, 7, 8 and 9 are generally in coaxial alignment.

As shown in FIG. 1, a frame 10 shaped like an arch gate having two vertical posts and an upper horizontal beam is erected firmly on the floor. This frame 10 stands independently from the frame 3. A winder assembly 11 is mounted steadily on the middle of the horizontal beam of the frame 10. A box 12 of the winder assembly 11 is adapted to rotate horizontally relative to the frame 10, on which it is supported, driven by a drive means, not shown. As shown in FIG. 2, a wire winder drum 13 is provided in the box 12 and they rotate horizontally in a body. The wire winder drum 13 is turned about its shaft by a drive means, not shown, so as to wind up or unwind a pull wire 14. The pull wire 14 is wound round the winder drum 13, and, in FIG. 2, a part of it is unwound to suspend vertically past the pull chamber 4 and into the main chamber 2. A seed holder 15 is provided at the lower end of the wire 14 for holding a seed crystal 16.

The winder assembly 11 supported by the frame 10 is also connected to the crystal pull chamber 4 by way of a flexible bellows tube 17 which is contractible and expansible as well as hermetic. The bellows tube 17 provides a communication passage between the winder assembly 11 and the pull chamber 4. In this embodiment, the bellows tube 17 is a welded bellows tube made of stainless steel, but it is possible to select other material for the bellows tube 17 so long as the material is heat resistant, oxidation resistant and airtight.

Next, the operation of the single crystal pulling apparatus 1 will be described with reference to FIG. 2.

At the beginning of the single crystal pulling operation, the isolation valve 5 is opened to thereby render the main chamber 2 and the pull chamber 4 into communication. Then, the air is drawn from the two chambers 2, 4 and an inert gas such as argon is supplied to them, and the single crystal pulling operation is carried out in this inert gas atmosphere.

Polycrystal raw material such as silicon is charged in the crucible 6 wherein the polycrystal material is melted down by the heater 8 to form a molten liquid 18. Then, the wire drum 13 is driven to turn in the direction of unwinding the pull wire 14. Thus, the wire 14 is lowered gradually, and the seed crystal 16 held by the seed holder 15 fixed at the lower end of the wire 14 is dipped in the molten liquid 18 contained in the crucible 6.

Next, the crucible shaft 7 and the crucible 6 supported thereon are caused to rotate about their common axis of rotation at a predetermined rate. Simultaneously with this, the wire winder drum 13 of the winder assembly 11 is caused to turn and wind up the pull wire 14 at a predetermined rate, and the box 12 of the winder assembly 11 is caused to turn around its rotation axis; thus, the pull wire 14 also spins together with the box 12 at a predetermined rate. As a result, the pull wire 14 rises and spins at the same time, and a single crystal sprouts from the seed crystal 16 provided at the seed holder 15 at the end of the pull wire 14, and is grown into an ingot W, as shown in FIG. 2.

The single crystal ingot W thus pulled up from the molten polycrystal liquid 18 is then lifted into the pull chamber 4, and when the isolation valve 5 is closed and the communication between the main chamber 2 and the pull chamber 4 is completely interrupted, a door of the pull chamber 4 is opened and the single crystal ingot W is removed from the pull chamber 4 through the door.

Since, as described above, the winder assembly 11 is supported by the frame 10 which is installed independently from the main chamber 2 and the pull chamber 4, even when the main chamber 2 is evacuated and heated and thus deformed causing the pull chamber 4 to rise, descend and/or tilt, the winder assembly 11 is not moved at all. The move of the pull chamber 4 only causes the flexible bellows tube 17 to flex, that is, to contract, expand, and/or bend. Therefore, the pull wire 14 remains in its original proper position so that the collinear relation of the pull wire 14 with the axis of rotation of the crucible 6 is maintained. As a result, even when the main chamber 2 is deformed during the single crystal pulling operation, the wire 14 does not swirl, the seed crystal 16 does not tilt, and the crystal does not get cranked, and the operation is carried on steadily and stably.

Also, since the winder assembly 11 is connected to the pull chamber 4 by way of the flexible bellows tube 17, the vibration created by the drive system of the winder assembly 11 is absorbed by the flexible bellows tube 17 and scarcely propagated to the pull chamber 4 so that the defectless growth of the single crystal is facilitated.

Next, a second embodiment of the invention will be described with reference to FIG. 3.

Figure 3:
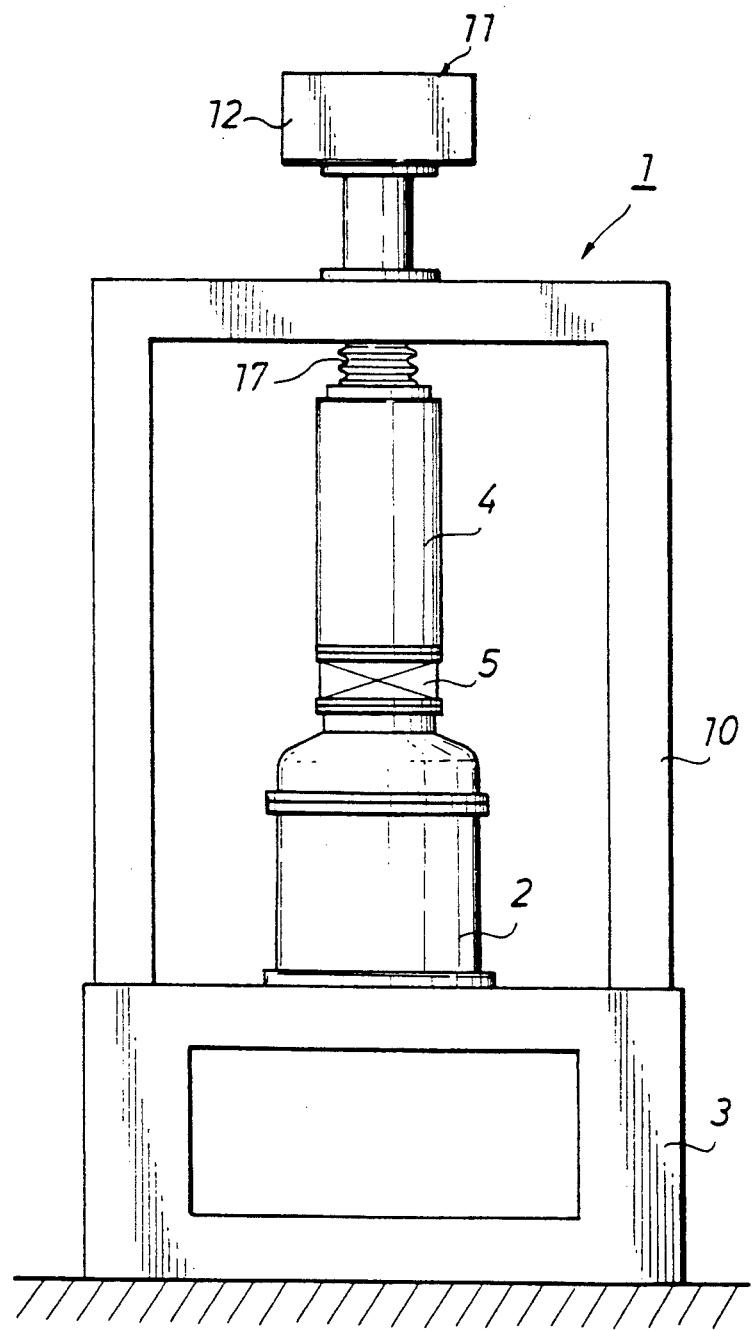
FIG. 3 is a front view of a single crystal pulling apparatus according to a second embodiment of the invention.

In FIG. 3, the same reference numerals are used to designate the elements which are fundamentally of the same structure and function as the corresponding ones that appear in FIG. 1. The only significant difference is found in the frames 3 and 10. In this second embodiment, the frame 10 which supports the winder assembly 11 is steadied on the frame 3 instead of on the floor. Still, the frame 10 stands quite independently from the main chamber 2 and the pull chamber 4 like in the single crystal pulling apparatus 1 of the first embodiment so that the same result is obtained in the second embodiment as in the first embodiment.

(Effects of the Invention)

As is clear from the above description, according to the invention: in the single crystal pulling apparatus 1, which includes the main chamber 2 steadied on the frame 3 installed on the floor, the pull chamber 4 provided above the main chamber 2 with the isolation valve 4 provided therebetween, and the winder assembly 11 provided above the pull chamber 4; another frame 10 is installed independently from the main chamber 2 and the pull chamber 4 to rigidly support the winder assembly 11 and the hermetical and flexible bellows tube 17 is provided between the winder assembly 11 and the pull chamber 4 as the communication passage between them; so that the winder assembly 11 is now supported only by the second frame 10 and not by the pull chamber 4, and as the result, the winder assembly 11 is not displaced by any deformation of the main chamber 2 nor is the pull wire 14 shifted to cease being collinear with the center line of the crucible 6. Also, the vibration created by the winder assembly 11 does not propagate itself beyond the vibration-absorbing bellows tube 17. Consequently, all the problems stated above are solved by the present invention.

The invention being thus described, it will be obvious that the same may be varied in many ways. Such variations are not to be regarded as a departure from the spirit and scope of the inventions, and all such modifications as would be obvious to one skilled in the art are intended to be included within the scope of the following claims.

What is claimed is:

1. A single crystal pulling apparatus having a main chamber steadied on a first frame body, a pull chamber provided above the main chamber with an isolation valve provided between said main chamber and said pull chamber, and a winder assembly provided above the pull chamber, said single crystal pulling apparatus further comprising a second frame body which is founded independently from the main chamber and the pull chamber, wherein said winder assembly is rigidly supported by said second frame body independently of said pull chamber, and a hermetical and flexible tube provided between the winder assembly and the pull chamber to communicate the winder assembly with the pull chamber.

2. A single crystal pulling apparatus as claimed in claim 1 wherein said second frame body is founded independently from the first frame body.

3. A single crystal pulling apparatus as claimed in claim 1 wherein said second frame body is founded on the first frame body independently from the main chamber.

4. A single crystal pulling apparatus as calimed in claim 1 wherein said hermetical and flexible tube is bellows.

5. A single crystal pulling apparatus comprising
   a first frame body,
   a main chamber and a pull chamber supported by said first frame body,
   a second frame body founded independently of said first frame body,
   a winder assembly rigidly supported on said second frame body and independent of said pull chamber, and
   vibration absorbing means located between said pull chamber and one of said second frame body and said winder assembly.

6. A single crystal pulling apparatus as recited in claim 5, wherein said vibration absorbing means is a bellows.

* * * * *